METHOD OF MANUFACTURING A SEMICONDUCTOR CAPACITANCE DIODE

Filed Jan. 31, 1972 4 Sheets-Sheet 1

United States Patent Office 3,764,415
Patented Oct. 9, 1973

3,764,415

METHOD OF MANUFACTURING A SEMICONDUCTOR CAPACITANCE DIODE

Gerhard Raabe, 2 Willinghusen, near Hamburg, Wiesenweg 5, Germany; Dieter Eckstein, 2 Hamburg 61, Rugierweg 29A, Germany; Heinz Sauermann, 2 Hamburg 54, Flasseheide 34, Germany; and Gerhard Winkler, 2 Schenefeld, Stuckweg 7, Germany Filed Jan. 31, 1972, Ser. No. 222,156
Claims priority, application Germany, Feb. 2, 1971, P 21 04 752.9
Int. Cl. H01l 7/36, 7/44
U.S. Cl. 148—191 18 Claims

ABSTRACT OF THE DISCLOSURE

A method of manufacturing a semiconductor capacitance diode in which a large capacity variation and an exponential variation of the capacity-voltage characteristic are obtained by the following manufacturing steps:

Figure 1:
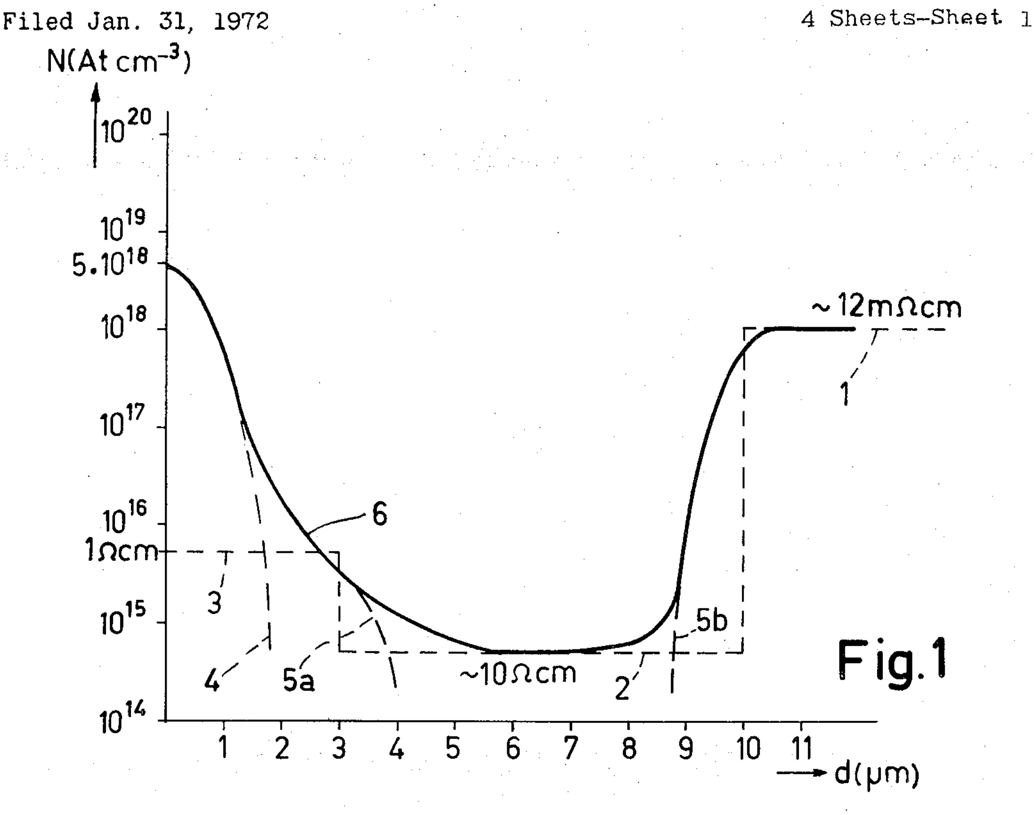
Figure 1A:
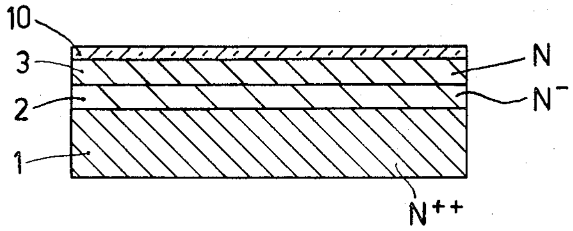
Figure 1B:
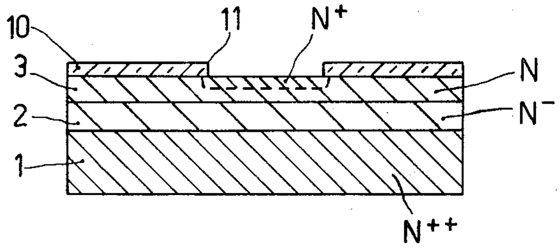
Figure 1C:
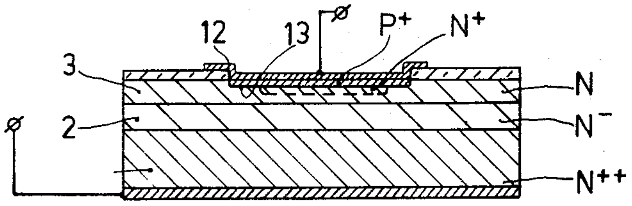

(1) No, one or several ever lower ohmic layers of the same conductivity type are provided on the high-ohmic layer on a low-ohmic substrate.
(2) By a suitable thermal treatment, the step-like doping profile resulting from the provided layer is rounded off by out-diffusion.
(3) Prior to providing the p-n junction in the last layer, at least one out-diffusion of a doping material causing the same conductivity type is carried out, as a result of which the conductivity is further increased.

The invention relates to a method of manufacturing a semiconductor device having a semiconductor capacitance diode in which a layer of the first conductivity type is provided on a low-ohmic substrate of the first conductivity type, which layer has a higher resistivity than the substrate, after which a doping element determining the second conductivity type is diffused in the semiconductor surface to form a p-n junction.

A capacitance diode having a large capacity variation and an exponential variation of the capacity-voltage characteristic is to be understood to mean herein a diode which may be used in the tuning circuits of radio receivers with medium wave range and capacitively tuned receivers for similar wave ranges.

In addition to the requirement of a great difference in doping concentration of the semiconductor body and hence of a great capacitance variation, the requirement must be imposed upon such capacitance diodes that the capacitance voltage characteristic has an exponential variation which is as accurate as possible.

In order to be able to manufacture capacitance diodes which meet said requirements reasonably, it is already known (see German, Offenlegungsschrift, 1,614,775) to start from a semiconductor body of a first conductivity type on which a first and a second epitaxial layer of the first conductivity type are provided, the conductivity of the first epitaxial layer adjoining the semiconductor body being smaller than that of the second epitaxial layer, impurities from the second epitaxial layer being diffused in the first epitaxial layer, a zone of the second conductivity type being provided in the second epitaxial layer and forming the p-n junction of the capacitance diode.

Furthermore it is already known (see German Offenlegungsschrift 1,947,300) for manufacturing capacitance diodes having a very steep p-n junction, to provide on a low-ohmic substrate of a first conductivity type a higher ohmic layer of the first conductivity type and to epitaxially grow on said layer, by means of a passivating layer in which an aperture is etched, a highly doped further layer of the second conductivity type which contains in addition the first conductivity type determining doping elements.

Upon heating the resulting semiconductor body, the first conductivity type determining doping elements diffuse from the epitaxially provided layer in the underlying semiconductor layer of the first conductivity type.

It has been found, however, that it is not possible with these known methods to manufacture a capacitance diode having such a large capacitance variation range and such a good capacitance-voltage characteristic that said diode can be used as tuning diode in radio receivers having medium wave range.

One of the objects of the invention is to improve the prior art and, starting from a method of manufacturing a semiconductor capacitance diode in which a high-ohmic layer is first provided on a low-ohmic substrate, to provide an improved method which enables the manufacture of the capacitance diode which satisfies the above-mentioned requirements.

The invention is inter alia based on the recognition of the fact that it is possible to obtain the desirable doping profile by providing, if any, at least one lower ohmic layer (that is to say, no lower ohmic layer, one lower ohmic layer or several lower ohmic layers) on the high-ohmic layer of the starting body, by a thermal treatment rounding off the step-like doping profile and by at least one subsequent in-diffusion.

Therefore, in manufacturing a semiconductor device of the type mentioned in the premable, the method is characterized in that at least a first layer of the first conductivity type is provided on the substrate, which layer has a higher-resistivity than the substrate, that by a heat treatment the step-like doping profile resulting from the provided layers is rounded off by thermal diffusion, and that prior to providing the p-n junction in the last provided layer, at least one diffusion of a doping element determining the first conductivity type takes place as a result of which the conductivity of the layer provided last is furthermore increased.

The doping profile obtained by means of the method according to the invention may, for example, satisfy the relationship: $N(x)=A/x^2$ ($A$=constant), with which a capacitance variation: $\ln C=K-k\times U_R$ corresponds. This capacitance vairation is one of the variations desired by the users of capacitance diodes.

In the two equations, the symbols have the following meanings:

$N(x)$=the impurity concentration at the area;
$x$=distance from the semiconductor surface to the p-n junction of the diode;
C=diode capacitance;
$U_R$=the cut-off voltage across the diode;
K=diode capacitance with $U_R=0$ (=diffusion capacitance); and
$k$=proportionality factor.

A doping profile which results in the desirable properties of the capacitance diode can already be obtained when on the first high-ohmic layer one lower ohmic layer is provided in which a doping material is then diffused, or when no further layer is provided on the first layer but now at least two doping materials are indiffused having different diffusion rates and different concentrations.

As a result of the indiffusion, the impurity concentration in the last layer is preferably increased to $5\times10^{17}$–$5\times10^{19}$ at./ccm.

Silicon which, for example, may be doped with antimony, is advantageously used as a semiconductor material, while the layers are advantageously grown on the substrate epitaxially and are doped, for example with phosphorus. Phosphorus is also preferably diffused in the last epitaxially grown layer. When two doping materials are to be indiffused, for example, arsenic or antimony may be used in addition to prosphorus.

The advantages resulting from the invention consist particularly in that capacitance diodes can be manufactured in a readily reproducible manner by means of a method which does not differ considerably from the standard methods of manufacturing semiconductor devices, of which diodes the capacitance variation range is so large and the variation of the capacitance voltage characteristic is so closely exponential that they can be used in tuning elements in radio receivers having medium wave range and in apparatus in which similar requirements are imposed upon the tuning elements.

In order that the invention may be readily carried into effect, it will now be described in greater detail, by way of example, with reference to the accompanying drawings, in which:

FIG. 1 shows the doping profile of a capacitance diode manufactured according to a first embodiment of the method according to the invention (two-fold epitaxy and single diffusion), FIGS. *1a* to *1c* are diagrammatic cross-sectional views of a capacitance diode manufactured according to the embodiment shown in FIG. 1 during various stages of its manufacture.

Figure 2:
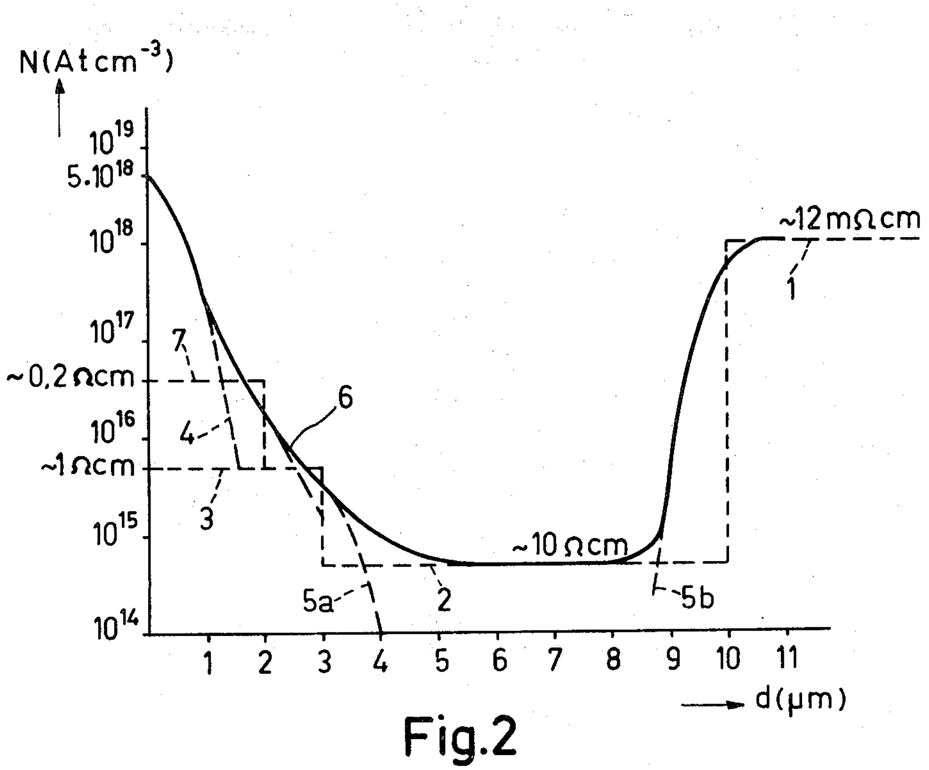
Figure 2A:
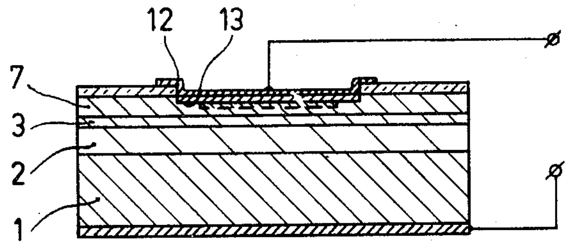
Figure 3:
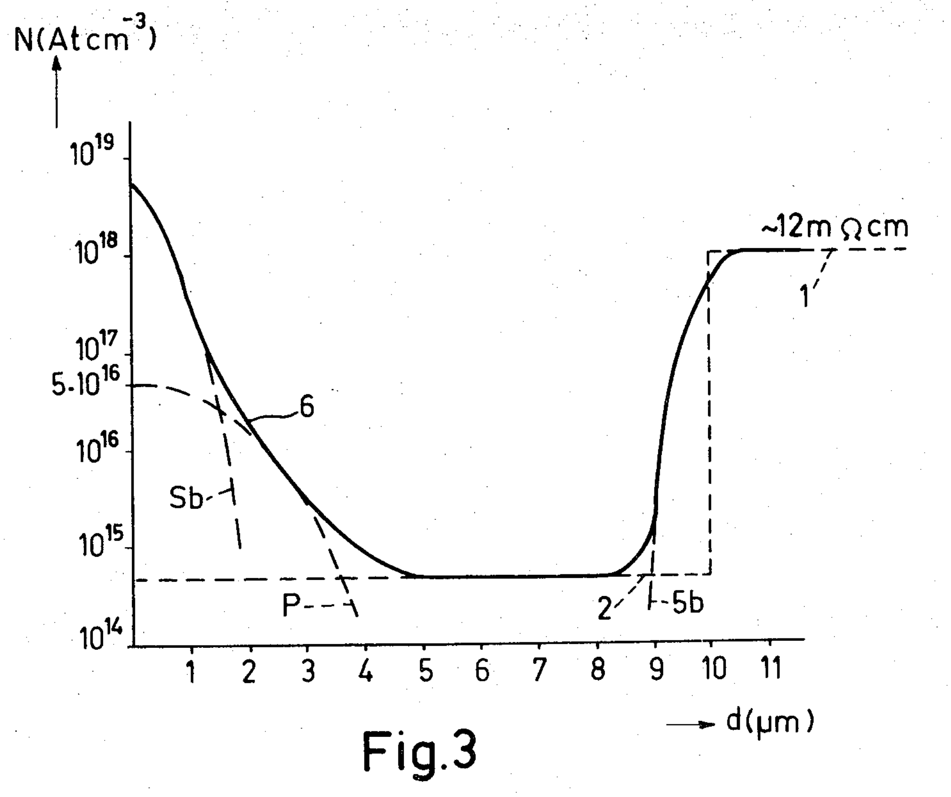
Figure 3A:
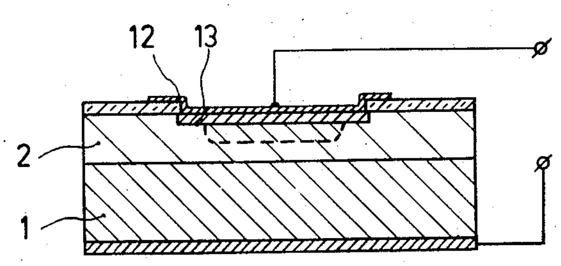
Figure 4:
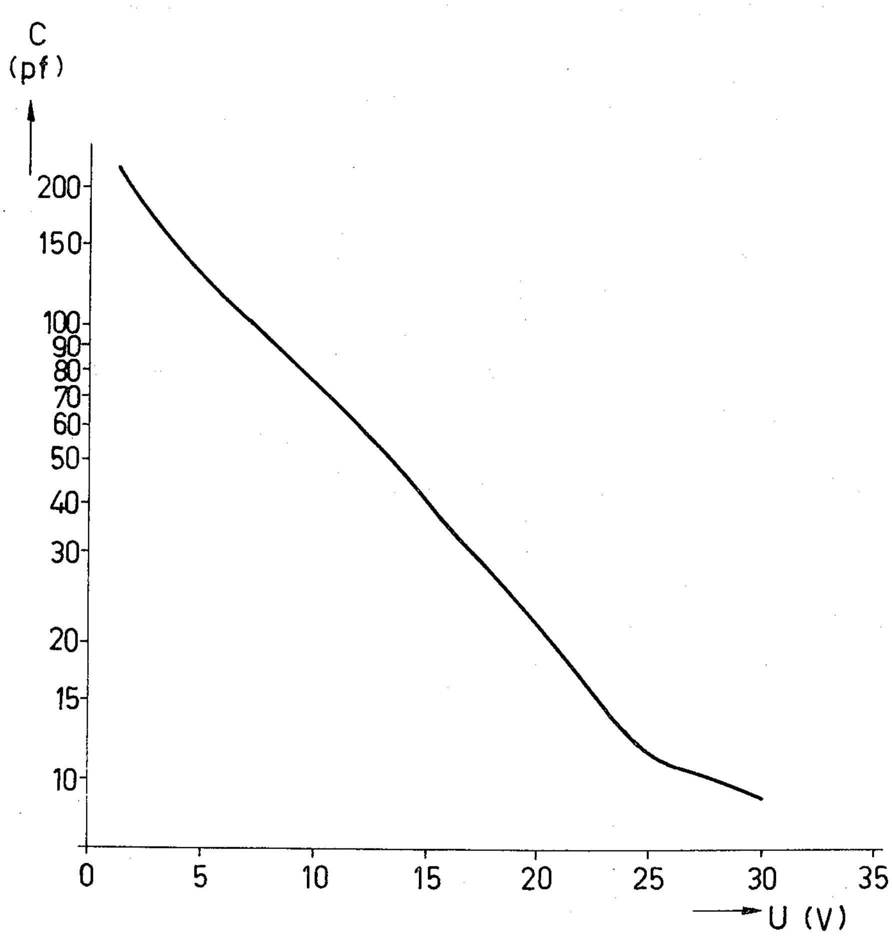

FIG. 2 shows the doping profile of a capacitance diode manufactured according to a second embodiment of the method according to the invention (three-fold epitaxy and single diffusion), FIG. *2a* is a diagrammatic cross-sectional view of a capacitance diode manufactured according to the embodiment shown in FIG. 2, FIG. 3 shows the doping profile of the device having a capacitance diode manufactured according to a third embodiment of the method according to the invention (single epitaxy and simultaneously performed two-components diffusion), FIG. *3a* is a diagrammatic cross-sectional view of a capacitance diode manufactured according to the embodiment shown in FIG. 3, and FIG. 4 shows the capacitance voltage characteristic of a device having a capacitance diode with a doping profile according to FIG. 1 or FIG. 2.

FIG. 1 shows the doping profile of a capacitance diode manufactured according to a first embodiment of the method according to the invention. As shown in FIG. *1a*, starting material is a silicon substrate 1, which is $n^+$ doped with antimony in such manner that a resistance of approximately 12 milliohm-cm. is obtained, A first high-ohmic epitaxial silicon layer 2, 9–12.5/um. thick, which is so strongly n-doped with phosphorus that a resistivity of 8–12 ohm.cm., preferably approximately 10 ohm.cm., is obtained, is then provided on said substrate by means of conventional methods. A second epitaxial silicon layer 3, 2.9–3.3/$\mu$. thick, which is also doped with phosphorus in such manner that a resistivity of 0.95–1.3 ohm.cm., preferably approximately 1 ohm.cm., is obtained, is then provided on said first epitaxial layer 2 preferably by means of the same method.

In FIG. 1, the doping concentration N in atoms/ccm. is plotted over a distance $d$ in $\mu$m. taken from the silicon surface of the semiconductor body. The resistivity values associated with the relevant doping concentrations are recorded beside the corresponding sections of the profile. A thermal oxide 10 (see FIG. *1a*) is provided on the second epitaxial layer 3. As a result of the thermal treatment required for said provision, a diffusion occurs simultaneously so that the initially step-like doping profile is rounded off.

As shown in FIG. *1b*, a diffusion window 11 is then provided in the silicon oxide 10 and phosphorus is indiffused through said window with a surface concentration of preferably $5\times10^{18}$ at./ccm. The doping profile 4 obtained only as a result of said phosphorus diffusion is shown in broken lines in FIG. 1. During this diffusion and during the above-mentioned thermal treatment necessary for the oxidation, the phosphorus present in the second epitaxial layer 3 on the one hand and the antimony present on the substrate 1 on the other hand also diffuse in the first epitaxial layer 2 and provide, considered in itself, the respective doping profiles **5*a* and 5*b* likewise shown in broken lines in FIG. 1. The various mentioned doping profiles overlap each other and thus result in the final doping profile 6** (solid line in FIG. 1).

After completion of the diffusion to obtain said doping profile, the surface of the semiconductor body is, for example, again oxidized after which in said oxide layer a further diffusion window 12 is provided which is larger than the window 11 for the indiffusion of the phosphorus and through which boron is then indiffused to a depth of approximately 0.9 $\mu$m. (see FIG. *1c*) to obtain the p-n junction 13.

After said second diffusion step, the actual capacitance diode is ready; the further treatment of the semiconductor body, namely the contacting, enveloping and so on, is then carried out according to known methods which are not described in detail here.

FIG. 2 shows the doping profile of a capacitance diode manufactured according to a second embodiment of the method according to the invention.

FIG. *2a* is a cross-sectional view through the capacitance diode manufactured in this manner. This method corresponds substantially to that of the preceding embodiments; the only difference is that a third epitaxial layer 7 having a thickness of approximately 2 $\mu$m. and a resistivity of approximately 0.2 ohm/cm. is provided on the second epitaxial layer 3.

FIG. 3 shows the doping profile and *3a* is a cross-sectional view of a capacitance diode manufactured according to a third embodiment of the method according to the invention. The starting material in this method is a substrate 1 having only one epitaxially grown high-ohmic layer 2. The characteristic values (thickness and resistivity) of said layer correspond to those of the layer 2 of the first embodiment. A silicon oxide coating layer 12, approximately 0.25 $\mu$m. thick, is provided on the high-ohmic epitaxial layer 2 by thermal oxidation. Windows for a two-fold $n^+$ diffusion to be carried out simultaneously are then provided in the silicon oxide layer. In this two-fold diffusion, phosphorus with a surface concentration of approximately $5\times10^{16}$ at./ccm. and antimony with a surface concentration of approximately $5\times10^{18}$ atoms/ccm. are simultaneously diffused. The corresponding depths of penetration are for phosphorus 2–2.5 $\mu$m. and for antimony 1.3–1.6 $\mu$m. The doping profiles obtained separately as a result of the two diffusions are shown in broken lines in FIG. 3 and denoted by the abbreviations for the corresponding impurity materials (P and Sb). These two doping profiles overlap each other and thus result in the final doping profile 6. All further steps of manufacture correspond to those of the fist embodiment.

FIG. 4 shows the capacitance variation in accordance with the applied voltage of a diode manufactured according to one of the above-described embodiments of the invention. This curve shows that with a voltage variation of 1–30 volt, a capacitance variation of approximately 10–250 pf. can be achieved.

This capacitance variation and the variation of the capacitance in accordance with the voltage are such that a similar capacitance diode can be used in radio receivers with a medium wave range and in apparatus in which similar requirements are imposed upon the tuning elements.

It will be obvious that the invention is not restricted to the embodiments described but that many variations are possible to those skilled in the art without departing from the scope of this invention. For example, in particular more epitaxial layers can be provided and more diffusion may be used, while other semiconductor materials and insulating materials may also be used,

What is claimed is:

1. A method of manufacturing a semiconductor device comprising a semiconductor capacitance diode, comprising the steps of:

(a) providing a semiconductor body comprising a low resistivity substrate of a first conductivity type and a first layer of said first conductivity type disposed on said substrate, said first layer having a higher resistivity than said substrate;

(b) providing at said first layer at least a second further layer having said first conductivity type thereby producing a structure having a surface layer and a substantially step-like doping impurity profile;

(c) thermally treating said structure such that said first conductivity type doping impurity partially diffuses from respectively said substrate and said second layer into said first layer, thereby producing a rounded off doping impurity profile exhibiting a relatively gradual change through said structure; then (d) diffusing into at least said surface layer at least one doping impurity of said first conductivity type so as to increase the conductivity of at least a surface portion of said surface layer; and then (e) diffusing into said surface layer a doping impurity of an opposite second conductivity type, thereby forming p-n junction therein.

2. A method of manufacturing a semiconductor device comprising a semiconductor capacitance diode, comprising the steps of:

(a) providing a semiconductor body comprising a low resistivity substrate of a first conductivity type and a surface layer of said first conductivity type disposed on said substrate, said surface layer having a higher resisitvity than said substrate;

(b) indiffusing into at least said surface layer at least two doping materials of said first conductivity type said materials having different diffusion rates and different concentrations; and then (c) providing in said surface layer a doping impurity of an opposite second conductivity type, thereby forming a p-n junction, said first conductivity type material being diffused to a greater depth than said p,n-junction.

3. A method of manufacturing a semiconductor device comprising a semiconductor capacitance diode, comprising the steps of:

(a) providing a semiconductor body comprising a low resistivity substrate of a first conductivity type and a first layer of said first conductivity type disposed on said substrate, said first layer having a higher resistivity than said substrate;

(b) providing at said first layer at least a further part having said first conductivity, thereby producing a structure having a surface portion and a substantially step-like doping impurity profile;

(c) thermally treating said structure such that said first conductivity type doping impurity partially diffuses from respectively said substrate and said further part into said first layer, thereby producing a rounded off doping impurity profile exhibiting a relatively gradual change through said structure; then (d) diffusing into at least said surface portion at least one doping impurity of said first conductivity type so as to increase the conductivity of at least a surface region of said surface portion; and then (e) providing in at least said surface portion a doping impurity of an opposite second conductivity type, thereby forming a p-n junction therein.

4. A method as recited in claim 3, wherein at least one of said first layer and said further part is provided by epitaxial deposition.

5. A method as recited in claim 3, wherein said first-mentioned diffusing step comprises indiffusing two doping materials of said first conductivity type, said materials having different diffusion rates and different concentrations.

6. A method as recited in claim 5, wherein said materials respectively consist essentially of phosphorus and arsenic.

7. A method as recited in claim 5, wherein said materials respectively consist essentially of phosphorus and antimony.

8. A method as recited in claim 3, wherein said doping concentration in said surface region is increased to about the range of $5\times10^{17}$ to $5\times10^{19}$ at./ccm. by said diffusion step prior to providing the p,n-junction.

9. A method as recited in claim 3, wherein said semiconductor body, said first layer, and said further part consist essentially of doped silicon.

10. A method as recited in claim 3, wherein said first conductivity type doping material in said substrate consists essentially of antimony.

11. A method as recited in claim 3, wherein said substrate is characterized by a resistivity value below the resistivity values of said first layer and said further part at least prior to said diffusion steps.

12. A method as recited in claim 3, wherein said first conductivity type material is diffused to a greater depth than said p,n-junction so that at least a portion of said junction adjoins said diffused surface region of said first conductivity type.

13. A method as recited in claim 3, wherein said opposite conductivity type doping impurity is provided in a surface zone of said surface portion, said surface zone extending laterally beyond and including a part of said surface region.

14. A method as recited in claim 3, wherein said further part comprises a further layer of said first conductivity type disposed on said first layer.

15. A method as recited in claim 14, wherein there are provided a plurality of said further layers of said first conductivity type, said further layers being disposed one upon another and each one of said further layers having a lower resistivity value than the further layer on which it is provided.

16. A method as recited in claim 15, wherein there are provided two said further layers of said first conductivity type, said second further layer having a lower resistivity than said first layer and the third further layer being disposed on said second layer and having a lower resistivity than said second layer, said third layer comprising said surface portion.

17. A method as recited in claim 14, wherein only one further layer of said first conductivity type is provided on said first layer, said further layer comprising said surface portion.

18. A method as recited in claim 17, wherein at least one of said first and further layers is epitaxially grown and is doped with phosphorus and said first conductivity type material diffused into said surface portion consists essentially of phosphorus.

References Cited

UNITED STATES PATENTS

| | | | |
|---|---|---|---|
| 3,611,058 | 10/1971 | Jordan | 317—234 UA |
| 3,638,301 | 2/1972 | Matsuura | 148—175 X |
| 3,201,664 | 8/1965 | Adam | 148—175 X |
| 3,249,831 | 5/1966 | New et al. | 148—190 X |
| 3,483,441 | 12/1969 | Hofflinger | 148—175 X |
| 3,345,221 | 10/1967 | Lesk | 148—175 |

GEORGE T. OZAKI, Primary Examiner

U.S. Cl. X.R.

148—187, 189, 190, 175; 317—234 R; 148—33.5

PO-1050
(5/69)

UNITED STATES PATENT OFFICE
CERTIFICATE OF CORRECTION

Patent No. 3,764,415 Dated October 9, 1973

Inventor(s) GERHARD RAABE ET AL

It is certified that error appears in the above-identified patent and that said Letters Patent are hereby corrected as shown below:

Column 3, line 45, change "$n^+$" to --$n^{++}$ --.

Signed and sealed this 28th day of January 1975.

(SEAL)
Attest:

McCOY M. GIBSON JR.
Attesting Officer

C. MARSHALL DANN
Commissioner of Patents